US011338499B2

(12) United States Patent
Song et al.

(10) Patent No.: US 11,338,499 B2
(45) Date of Patent: May 24, 2022

(54) SUBSTRATE

(71) Applicant: LG Chem, Ltd., Seoul (KR)

(72) Inventors: Cheol Ock Song, Daejeon (KR); Seung Heon Lee, Daejeon (KR); Ji Young Hwang, Daejeon (KR); Han Min Seo, Daejeon (KR); Nam Seok Bae, Daejeon (KR); Jin Woo Park, Daejeon (KR); Jung Sun You, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/780,243

(22) Filed: Feb. 3, 2020

(65) Prior Publication Data

US 2020/0276750 A1 Sep. 3, 2020

Related U.S. Application Data

(63) Continuation of application No. PCT/KR2018/009329, filed on Aug. 14, 2018.

(30) Foreign Application Priority Data

Aug. 18, 2017 (KR) ........................ 10-2017-0104654

(51) Int. Cl.
*G02F 1/1339* (2006.01)
*G02F 1/1335* (2006.01)
(Continued)

(52) U.S. Cl.
CPC .......... *B29C 59/022* (2013.01); *B29C 59/046* (2013.01); *G02F 1/13394* (2013.01);
(Continued)

(58) Field of Classification Search
None
See application file for complete search history.

(56) References Cited

U.S. PATENT DOCUMENTS 6,016,181 A 1/2000 Shimada
8,357,484 B2 1/2013 Son et al.
(Continued)

FOREIGN PATENT DOCUMENTS

EP 3022311 A1 1/1981
EP 2827361 A1 1/2015
(Continued)

OTHER PUBLICATIONS

Extended European Search Report including Written Opinion for Application No. EP18846820.1, dated May 26, 2020, pp. 1-7.
(Continued)

*Primary Examiner* — Richard H Kim
(74) *Attorney, Agent, or Firm* — Lerner, David, Littenberg, Krumholz & Mentlik, LLP

(57) ABSTRACT

A substrate and a method for producing the same are disclosed herein. In some embodiments, a substrate includes a base layer, a black layer formed on the base layer, and column spacers formed on the black layer, wherein a loss rate of spacers measured by a peel test is 15% or less. The substrate can have excellent adhesiveness of the spacer to the base layer or the black layer and ensuring appropriate darkening properties. The method can effectively produce such a substrate without adverse effects such as occurrence of foreign materials without separate treatment such as heat treatment.

7 Claims, 12 Drawing Sheets

20
302
301
302
10

(51) Int. Cl.

| | |
|---|---|
| ***G02F 1/1362*** | (2006.01) |
| ***B29C 59/02*** | (2006.01) |
| ***B29C 59/04*** | (2006.01) |
| ***G02F 1/1347*** | (2006.01) |
| ***G03F 1/58*** | (2012.01) |

(52) U.S. Cl.

CPC ...... *G02F 1/13398* (2021.01); *G02F 1/13471* (2013.01); *G02F 1/133512* (2013.01); *G02F 1/136209* (2013.01); *G03F 1/58* (2013.01)

(56) References Cited

U.S. PATENT DOCUMENTS

| | | | | |
|---|---|---|---|---|
| 2002/0139981 | A1 | 10/2002 | Young | |
| 2003/0002004 | A1 | 1/2003 | Kouya | |
| 2003/0030766 | A1* | 2/2003 | Kiguchi | G02B 5/201 349/106 |
| 2005/0134169 | A1 | 6/2005 | Hwang | |
| 2005/0140858 | A1 | 6/2005 | Park | |
| 2006/0103789 | A1* | 5/2006 | Takahashi | G02F 1/13394 349/110 |
| 2006/0238693 | A1* | 10/2006 | Yoon | G02F 1/13394 349/155 |
| 2012/0204745 | A1 | 8/2012 | Jo et al. | |
| 2015/0044417 | A1 | 2/2015 | Koike | |
| 2017/0102578 | A1* | 4/2017 | Shin | G02F 1/133514 |
| 2017/0268929 | A1 | 9/2017 | Li et al. | |

FOREIGN PATENT DOCUMENTS

| | | | | |
|---|---|---|---|---|
| JP | H02144525 | A | | 6/1990 |
| JP | H0659228 | A | | 3/1994 |
| JP | H10142610 | A | | 5/1998 |
| JP | H1195194 | A | | 4/1999 |
| JP | H11174459 | A | | 7/1999 |
| JP | 2000147516 | A | | 5/2000 |
| JP | 2000171805 | A | | 6/2000 |
| JP | 2000180862 | A | | 6/2000 |
| JP | 2001154206 | A | | 6/2001 |
| JP | 2002296579 | A | | 10/2002 |
| JP | 2002333632 | A | | 11/2002 |
| JP | 2003066467 | A | | 3/2003 |
| JP | 2004519866 | A | | 7/2004 |
| JP | 2004354433 | A | | 12/2004 |
| JP | 2005049575 | A | | 2/2005 |
| JP | 2005092155 | A | | 4/2005 |
| JP | 2006098559 | A | | 4/2006 |
| JP | 2012174410 | A | | 9/2012 |
| JP | 2012198879 | A | | 10/2012 |
| JP | 2015026049 | A | | 2/2015 |
| JP | 2016068383 | A | | 5/2016 |
| JP | 3041572 | B2 | | 12/2016 |
| KR | 20040051951 | A | | 6/2004 |
| KR | 20050051817 | A | | 6/2005 |
| KR | 20070036911 | A | | 4/2007 |
| KR | 101275802 | B1 | | 6/2013 |
| KR | 20140006767 | A | | 1/2014 |
| KR | 1020140061786 | A | * | 5/2014 |
| KR | 20140133607 | A | | 11/2014 |
| TW | 201219465 | A | | 5/2012 |
| TW | 201241691 | A | | 10/2012 |
| TW | 201346985 | A | | 11/2013 |
| WO | 2013137176 | A1 | | 9/2013 |

OTHER PUBLICATIONS

Search report from International Application No. PCT/KR2018/009329, dated Nov. 30, 2019.

Search Report from Taiwan Application No. 107128706 dated May 24, 2019.

* cited by examiner

[Figure 1]
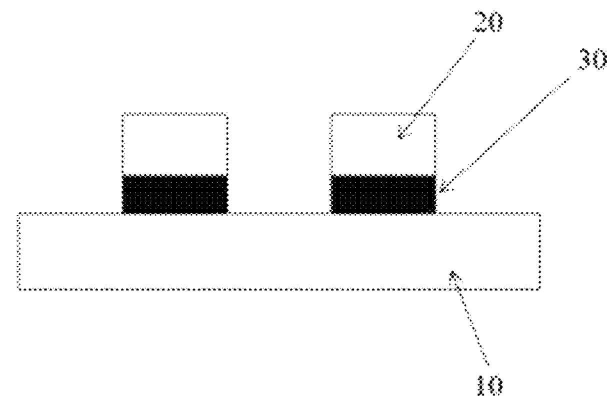
[Figure 2]
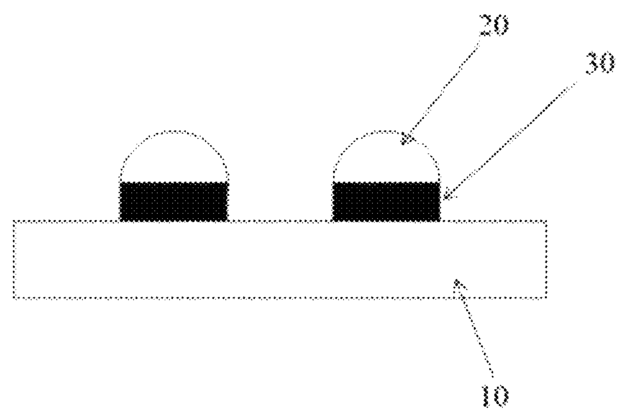
[Figure 3]
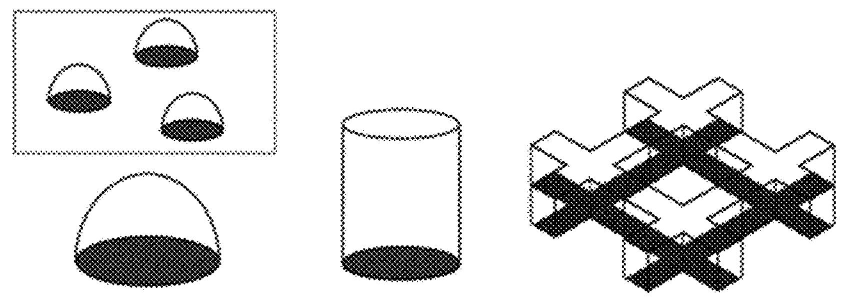

[Figure 4]
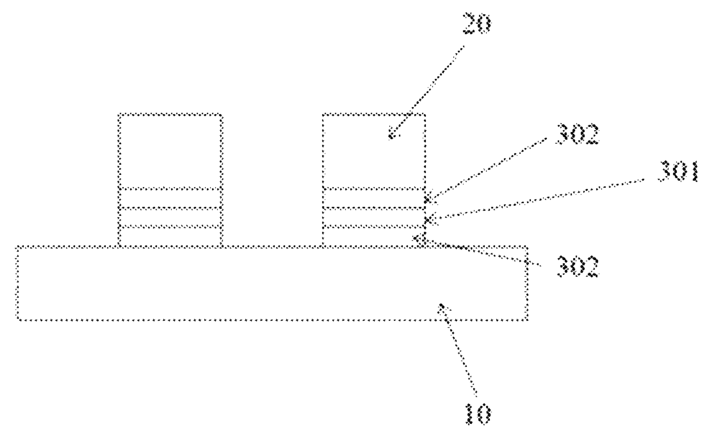
[Figure 5]
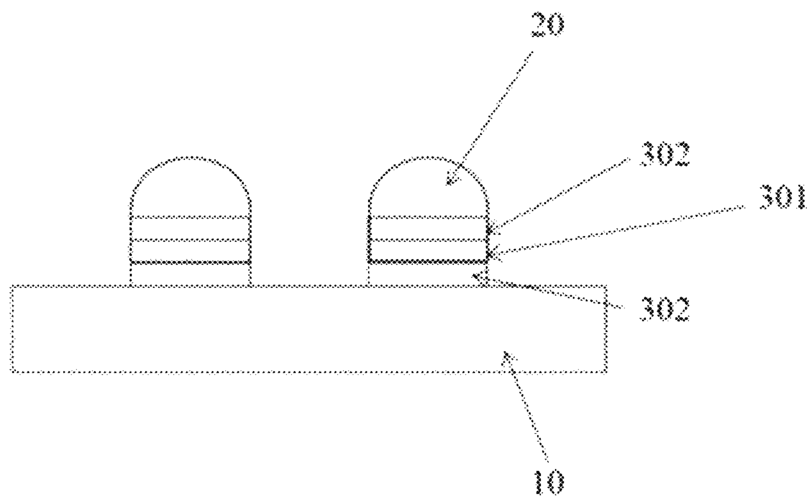

[Figure 6]
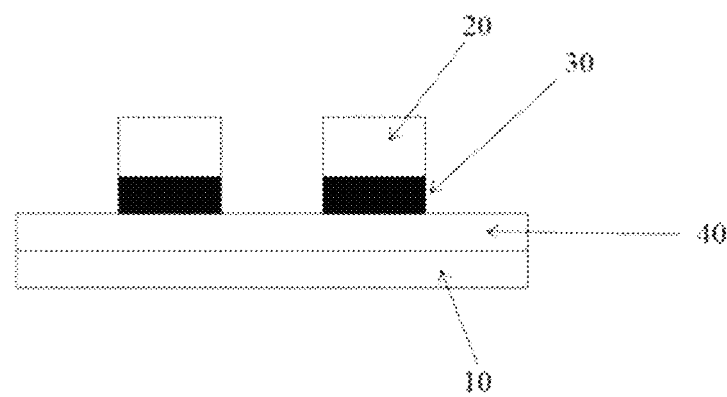
[Figure 7]
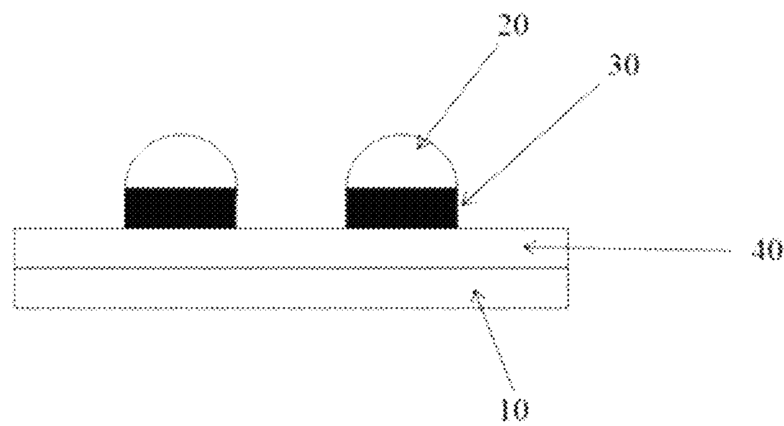
[Figure 8]
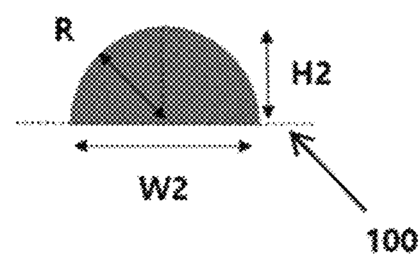

[Figure 9]
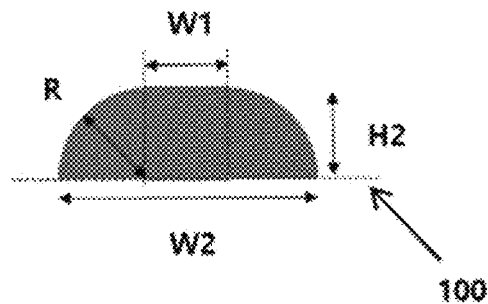
[Figure 10]
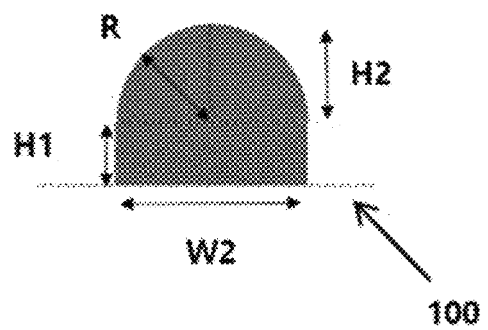
[Figure 11]
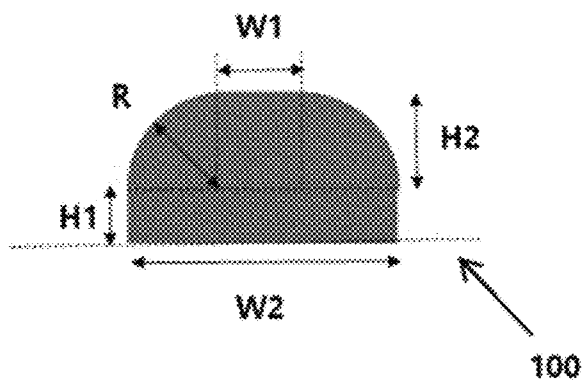

[Figure 12]
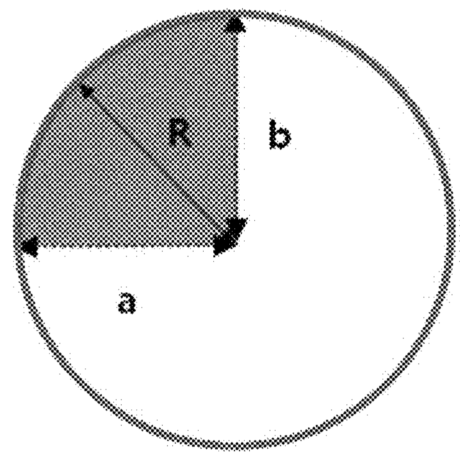
[Figure 13]
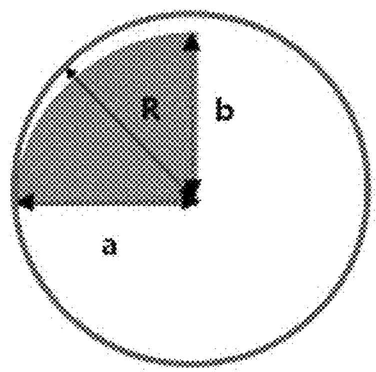
[Figure 14]
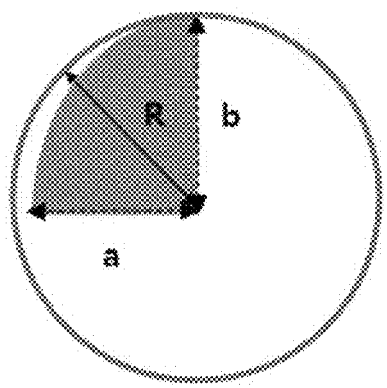

[Figure 15]
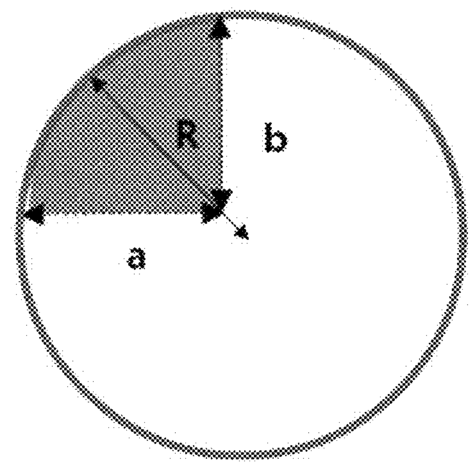
[Figure 16]
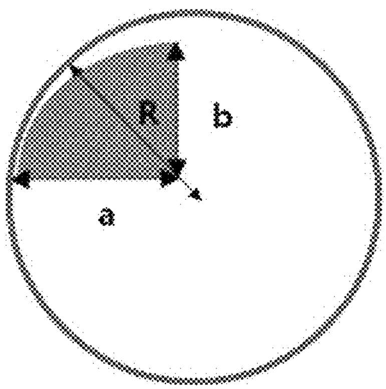
[Figure 17]
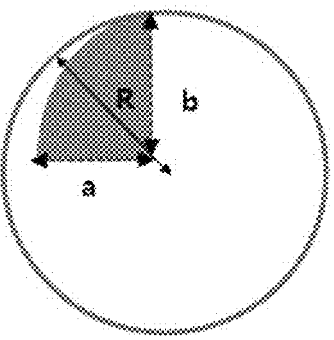

[Figure 18]
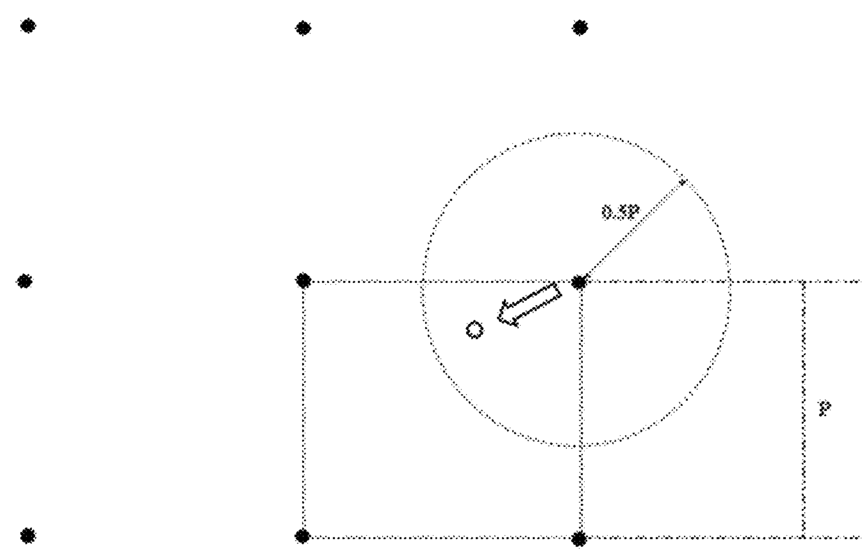

[Figure 19]
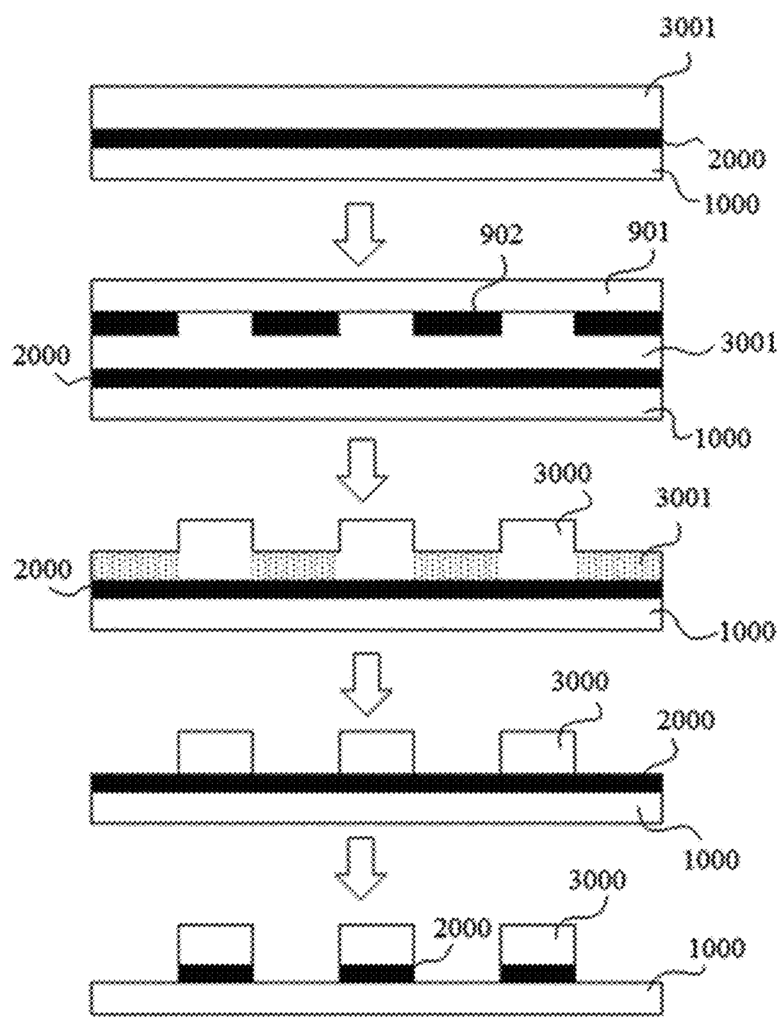

[Figure 20]
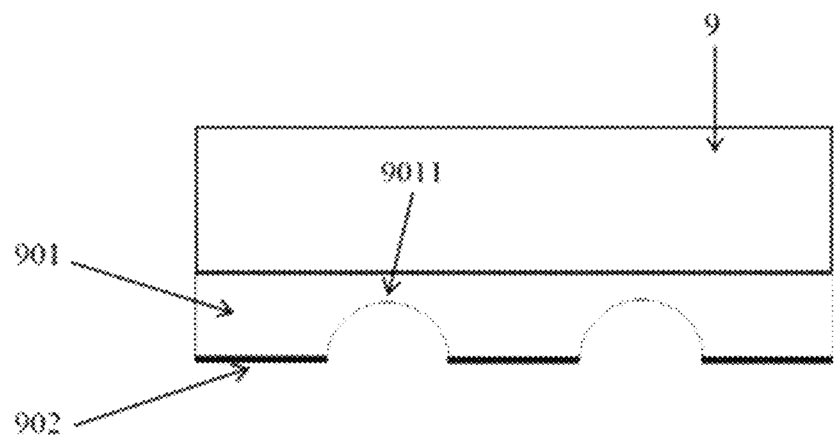
[Figure 21]
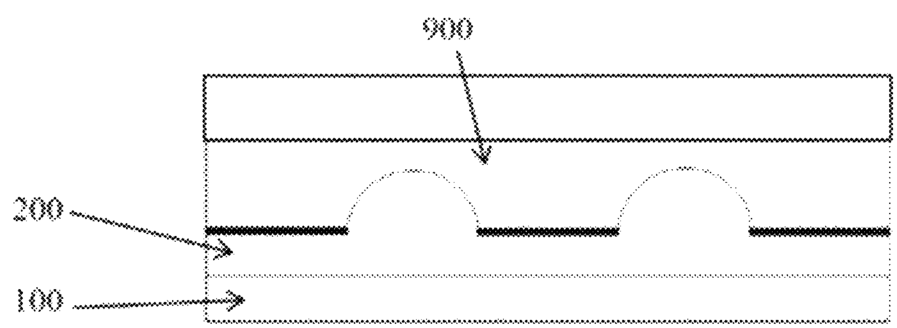
[Figure 22A] [Figure 22B]
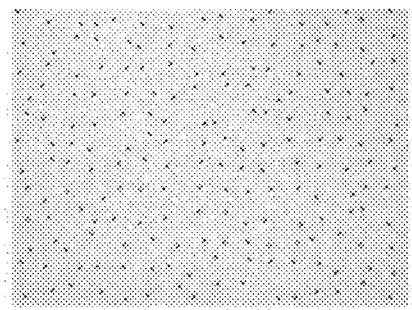
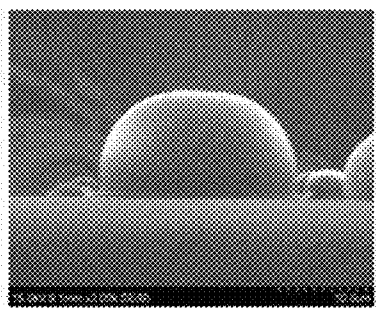

[Figure 23]
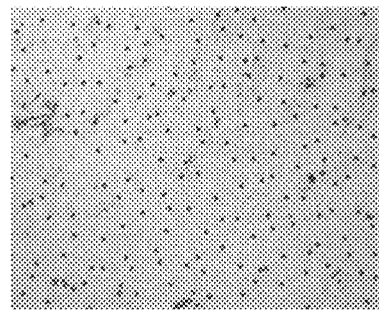
[Figure 24]
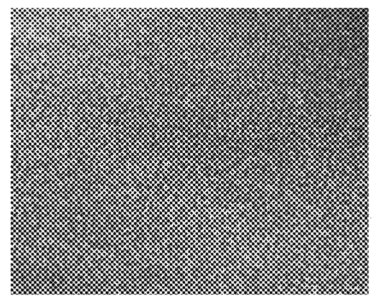
[Figure 25]
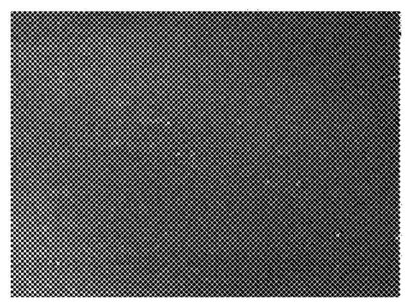
[Figure 26]
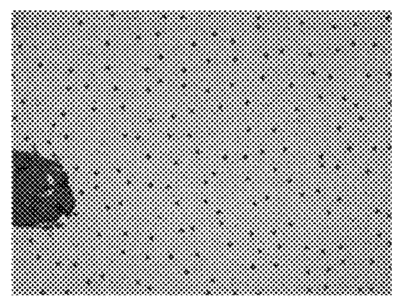

[Figure 27]
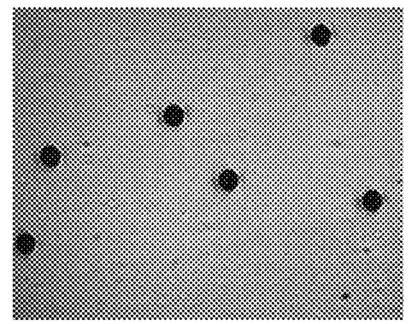
[Figure 28]
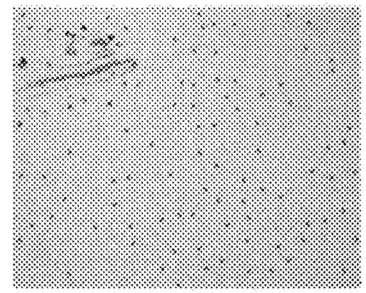
[Figure 29]
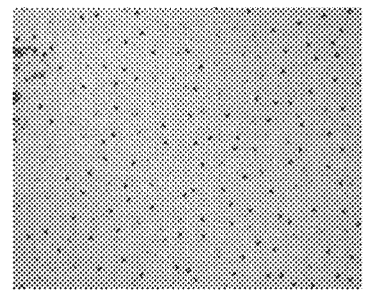
[Figure 30]

[Figure 31]
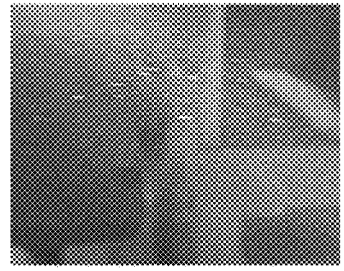

SUBSTRATE

CROSS-REFERENCE TO RELATED APPLICATION(S)

The present application is a continuation of International Application No. PCT/KR2018/009329, filed on Aug. 14, 2018, which claims priority from Korean Patent Application No. 10-2017-0104654, filed on Aug. 18, 2017, the disclosures of which are incorporated by reference herein.

TECHNICAL FIELD

The present application relates to a substrate and a method for producing the same.

BACKGROUND ART

An optical device capable of adjusting light transmittance or colors or reflectance by disposing a light modulating material comprising a liquid crystal compound between substrates disposed opposite to each other is known.

For example, Patent Document 1 discloses a so-called GH cell (guest host cell) applying a mixture of a liquid crystal host and a dichroic dye guest.

In such a device, so-called spacers are located between the substrates to maintain the spacing between the substrates.

In some cases, the spacers may need to be darkened depending on the state in which the optical device is implemented. As a method for darkening the spacer, there is a method that as a black layer is formed on a base layer and a spacer is formed thereon, the spacer looks black when observed on the base layer side or the top.

PRIOR ART DOCUMENTS

Patent Documents

Patent Document 1: European Patent Publication No. 0022311

BRIEF DESCRIPTION OF DRAWINGS

FIGS. 1, 2, 4 to 7 are diagrams showing structures of exemplary substrates in accordance with the present disclosure.

FIG. 3 is an exemplary diagram showing the form of forming a spacer.

FIGS. 8 to 11 are schematic diagrams of exemplary forms of spacers in accordance with the present disclosure.

FIGS. 12 to 17 are diagrams for explaining exemplary forms of spacers in accordance with the present disclosure.

FIG. 18 is a diagram for explaining a method of implementing a degree of irregularity in accordance with the present disclosure.

FIGS. 19 and 21 are diagrams schematically showing the process of producing a substrate in accordance with the present disclosure.

FIG. 20 is an example of a mask shape applied in the process of producing a substrate in accordance with the present disclosure.

FIGS. 22 A-B illustrate top down and side views, respectively, of scanning electron microscopy (SEM) images showing the shape of the spacer produced in Example 1 and its arrangement on the substrate in accordance with the present disclosure.

FIG. 23 is a view showing the result of evaluating adhesiveness of the spacers produced in Example 1 to the black layer in accordance with the present disclosure.

FIG. 24 is a view showing the result of evaluating whether or not foreign materials occur with respect to the spacers produced in Example 1 in accordance with the present disclosure.

FIG. 25 is a view showing the result of evaluating whether or not foreign materials occur with respect to the spacer produced in Example 2 in accordance with the present disclosure.

FIG. 26 is a view showing the result of evaluating adhesiveness of the spacers produced in Example 2 to the black layer in accordance with the present disclosure.

FIG. 27 is an OM image showing the result of forming a rubbing alignment film on the spacers produced in Example 2 in accordance with the present disclosure.

FIGS. 28 and 29 show the results of evaluating whether or not adhesiveness is present for the spacers formed in Comparative Examples 1 and 2, respectively.

FIGS. 30 and 31 show the results of evaluating whether or not foreign materials occur for the spacers formed in Comparative Examples 3 and 4, respectively.

DISCLOSURE

Technical Problem

The present application provides a substrate and a method for producing the same. An object of the present application is to provide a substrate ensuring good adhesion between a spacer and a base layer and/or a spacer and a black layer in a state where appropriate darkening is ensured, and another object is to provide a method capable of simply and effectively producing such a substrate without adverse effects such as occurrence of foreign materials.

Technical Solution

Among physical properties mentioned in this specification, when the measured temperature affects the results, the relevant physical properties are physical properties measured at room temperature, unless otherwise specified. The term room temperature is a natural temperature without being heated or cooled, which may be, for example, any temperature in a range of 10° C. to 30° C., or about 23° C. or about 25° C. or so. In addition, unless otherwise specified herein, the unit of temperature is ° C.

Among physical properties mentioned in this specification, when the measured pressure affects the results, the relevant physical properties are physical properties measured at room pressure, unless otherwise specified. The term normal pressure is a natural pressure without being pressurized or depressurized, where usually about 1 atm is referred to as the normal pressure.

The present application relates to a substrate and a method for producing the same, and in one example, the substrate may have a structure that comprises a base layer and a spacer present on the base layer, and also comprises a black layer between the spacer layer and the base layer. FIGS. 1 and 2 are diagrams showing, as an exemplary substrate of the present application, the case where the spacer (20) is present on a base layer (10).

In the substrate of the present application, the spacer exhibits excellent adhesion to the base layer or elements of the base layer (for example, an electrode layer or the black layer) that the spacer contacts.

For example, the loss rate of the spacers measured by performing a peel test on the surface of the base layer on which the spacers are formed may be about 15% or less or so. The peel test is performed by attaching a pressure-sensitive adhesive tape having peel force in a level of about 3.72N/10 mm to 4.16N/10 mm on the surface of the base layer on which the spacers are formed, and then peeling it off. As the pressure-sensitive adhesive tape, a tape known as a Nichiban Tape CT-24 can be used. The Nichiban tape has the peel force in a level of about 3.72N/10 mm to 4.16N/10 mm as measured at a peel angle of 180 degrees in accordance with JIS Z 1522 standard. The peel test may be performed by attaching the Nichiban tape CT-24 to the surface of the base layer, on which the spacers are formed, with a rectangular attachment area of 24 mm in width and 40 mm in length and then peeling the Nichiban tape CT-24 in the longitudinal direction at a peel rate of about 30 mm/s and a peel angle of about 180 degrees. The loss rate of the spacers measured by performing the peel test may be 15% or less, 13% or less, 11% or less, 9% or less, 8% or less, 7% or less, 6% or less, 5% or less, 4% or less, 3% or less, 2% or less, 1% or less, or 0.5% or less. Here, the loss rate may be a percentage of the number of spacers that have been lost after peeling the pressure-sensitive adhesive tape off relative to the number of all the spacers existing within the attachment area. Depending on the applied use, usually 10,000 to 40,000 spacers may be present in the above attachment area, where the ratio of the spacers to be lost among these spacers may be maintained in the above range.

In the case of the substrate structure of the present application, it is not easy to control the curing rate of the spacer material due to the presence of the black layer or the like, and thus it is very difficult to form the spacer with excellent sticking force as above. However, according to the production method of the present application to be described below, excellent adhesiveness as described above can be ensured in a state where darkening is effectively performed.

In the case where the spacer exhibits such adhesiveness, even if an alignment film is formed on the surface and alignment treatment such as rubbing proceeds, the spacer may be stably maintained, so that it is possible to finally manufacture a product having excellent performance. In addition, the substrate on which the spacer is formed can be maintained in a state where a protective pressure-sensitive adhesive film is attached to the surface on which the spacer is formed until it is applied to an actual product, where in such a structure, the pattern can be stably maintained without being lost, even if the pressure-sensitive adhesive film is peeled off.

As the base layer, any base layer used in a substrate in a configuration of a known optical device such as an LCD (liquid crystal display) can be applied without particular limitation. For example, the base layer may be an inorganic base layer or an organic base layer. As the inorganic base layer, a glass base layer or the like can be exemplified, and as the organic base layer, various plastic films or the like can be exemplified. The plastic film can be exemplified by a TAC (triacetyl cellulose) film; a COP (cycloolefin copolymer) film such as a norbornene derivative; an acrylic film such as PMMA (poly(methyl methacrylate); a PC (polycarbonate) film; a polyolefin film such as PE (polyethylene) or PP (polypropylene); a PVA (polyvinyl alcohol) film; a DAC (diacetyl cellulose) film; a Pac (polyacrylate) film; a PES (polyether sulfone) film; a PEEK (polyetheretherketone) film; a PPS (polyphenylsulfone) film, a PEI (polyetherimide) film; a PEN (polyethylenemaphthatate) film; a PET (polyethyleneterephtalate) film; a PI (polyimide) film; a PSF (polysulfone) film or a PAR (polyarylate) film, and the like, but is not limited thereto.

In one example, the base layer may be a so-called flexible base layer. In the present application, a black layer to be described below can also be effectively formed on the flexible base layer without defects such as cracks, and durability of the black layer can be secured even when the base layer is bending according to applications or the like. The specific kind of the flexible base layer is not particularly limited, and among the above-described base layers, a plastic film or a very thin inorganic base material such as thin glass can be mainly used as the flexible base layer.

In the substrate of the present application, the thickness of the base layer is also not particularly limited, where an appropriate range may be selected depending on applications.

A spacer is present on the base layer. The spacer may be fixed to the base layer. In this case, the spacer may be fixed directly in contact with the base layer, or if there are other layers between the base layer and the spacer, it may be fixed on the relevant other layer. The kind of the other layer includes a known layer necessary for driving the optical device, and for example, an electrode layer or a black layer, and the like, which is described below, can be exemplified.

In one example of the substrate of the present application, the spacer may be a transparent column spacer, and a black layer may be formed on the bottom of the transparent column spacer.

Here, the fact that the spacer is transparent means a case where the transmittance for light having at least one of wavelength regions or the entire wavelength region in the visible light region is 50% or more, 55% or more, 60% or more, 65% or more, 70% or more, 75% or more, 80% or more, 85% or more, or 90% or more, and in this case, the upper limit of the transmittance is not particularly limited. The transparent column spacer as above can be formed by a method to be described below using a transparent resin. Typically, the visible light region is approximately 380 nm to 720 nm, and in one example, the transmittance can be measured at a wavelength of approximately 550 nm.

In the present application, the shape of the column spacer is not particularly limited, and for example, a cylindrical shape, a polygonal column shape such as a triangular, quadrangular, pentagonal or hexagonal column shape, a hemispherical shape, a mesh shape or other shapes can be all applied. FIG. 1 is a cross-sectional diagram to which a quadrangle columnar spacer (20) is applied, and FIG. 2 is a cross-sectional diagram to which a hemispherical spacer (20) is applied.

In the present application, a black layer is present on the bottom of the transparent column spacer, i.e., between the transparent column spacer and the base layer.

In this specification, the term top means the direction from the base layer toward the spacer formed on the base layer, and the bottom means the opposite direction of the top. Here, the black layer may also mean a layer having an optical density of about 1 to 6 or so. The black layer may also exhibit the optical density when observed in any one direction of the top and the bottom of the substrate, and in some cases, it may exhibit the optical density when observed in both of the top and bottom sides. The optical density can be obtained by measuring the transmittance (unit: %) of the black layer and then substituting it into an equation of optical density (optical density$=-\log_{10}(T)$, where T is the transmittance). In another example, the optical density may be about 1.5 or more, 2 or more, 2.5 or more, 3 or more, 3.5 or more, 4 or more or 4.5 or more or so, or may be about 5.5 or less or 5 or less or so.

FIG. 3 is a schematic diagram showing a case where a black layer is formed on the upper or lower part of a hemispherical, cylindrical, rectangular columnar or mesh-shaped spacer.

In an optical device capable of adjusting light transmittance, colors and/or reflectance, the region where the spacer exists becomes an optically inactive region. Therefore, in some cases, it is necessary to black the region where the spacer exists. To this end, for example, a method of blacking the spacer itself, such as a method of manufacturing a column spacer using a black resin, may be considered, but in such a case, since the black resin itself absorbs light, so that a curing process is not easy, it is not easy to manufacture a high step spacer. However, the introduction of such a structure can form a substrate which prevents degradation of optical characteristics due to inactive regions upon driving an optical device, while being formed in high steps. In addition, when the structure is formed by a method to be described below, it is also possible to manufacture the substrate having excellent adhesiveness as described above.

For example, the spacer may have a height in a range of 1 μm to 50 μm. In another example, the height may be 3 μm or more, 5 μm or more, 7 μm or more, 9 μm or more, 11 μm or more, 13 μm or more, 15 μm or more, 17 μm or more, 19 μm or more, 21 μm or more, 23 μm or more, 25 μm or more, or 27 μm or more, and may also be 48 μm or less, 46 μm or less, 44 μm or less, 42 μm or less, 40 μm or less, 38 μm or less, 36 μm or less, 34 μm or less, 32 μm or less, 30 μm or less, 28 μm or less, or 26 μm or less.

The black layer may be formed using various materials capable of realizing black. For example, the black layer may be a metal layer, a metal oxide layer, a metal nitride layer or a metal oxynitride layer, or may be a layer containing a pigment or a dye.

The specific material of the black layer is not particularly limited, and for example, a metal such as Ni, V, W, Ta, Mo, Nb, Ti, Fe, Cr, Co, Al or Cu, an alloy metal containing two or more of the metals, an oxide, a nitride or an oxynitride of the metal, and the like can be used, and various pigments or dyes capable of realizing black can also be used.

Depending on the purpose, the black layer may have a single-layer structure or a multilayer structure. In one example, the black layer may have a multilayer structure in order to achieve the desired darkening while ensuring process efficiency. For example, the black layer may have a multilayer structure of a two-layer structure comprising a first layer which is a metal layer and a second layer which is a metal oxide layer, a metal nitride layer or a metal oxynitride layer, or a three-layer structure in which the second layer is formed on both sides of the first layer. In one example, the second layer may be a metal oxynitride layer. FIGS. 4 and 5 are examples of a substrate on which a black layer having a three-layer structure, wherein the first layer (301) and the second layer (302) are formed thereon as above, is formed. In such a multilayer structure, the inherent refractive indexes, transmission characteristics and/or reflection characteristics of the first layer and the second layer may be correlated with each other to attain an appropriate darkening, and particularly, in the case of the above-mentioned multilayer structure of three layers or more, the appropriate darkening may be achieved on both sides of the black layer. The specific kind of the metal, the metal oxide, the metal nitride and/or the metal oxynitride used in the first layer and the second layer is not particularly limited, and for example, a suitable kind among the above-mentioned materials can be selected. In one example, the second layer may have an oxide, nitride or oxynitride containing the same metal as applied in the first layer.

The spacer and the black layer as above may be overlapped with each other when viewed from the top or bottom.

The black layer may have an area equal to or smaller than that of the bottom of the spacer. That is, for example, the black layer may exist only substantially within the area where the spacer is present. For example, the ratio (T/B) of the area (B) of the black layer and the area (T) of the bottom of the spacer may be in a range of 0.5 to 1.5. In another example, the ratio (T/B) may be about 0.55 or more, about 0.6 or more, about 0.65 or more, about 0.7 or more, about 0.75 or more, about 0.8 or more, about 0.85 or more, about 0.9 or more, or about 0.95 or more. Also, in another example, the ratio (T/B) may be about 1.45 or less, about 1.4 or less, about 1.35 or less, about 1.3 or less, about 1.25 or less, about 1.2 or less, about 1.15 or less, about 1.1 or less, or about 1.05 or less. In this arrangement, it is possible to suitably prevent light leakage or the like from being caused upon driving the optical device, while ensuring adequate adhesion of the spacer to the substrate.

Such a black layer may have an appropriate thickness in consideration of the desired step and darkening, and the like. For example, the thickness of the black layer may be in a range of 30 nm to 5000 nm. The thickness of each layer in the case where the black layer is formed in a multilayer structure can also be selected in consideration of the desired step and/or darkening, and the like. For example, in the above-mentioned multilayer structure, each of the first layer and the second layer may have a thickness in a range of 30 nm to 200 nm.

In one example, the black layer may be formed based on a material having a physical ductility value of 0.6 or more. In this specification, the term physical ductility value is a value known in the industry per material, which is a value obtained through the following equations A and B based on the Poisson ratio (v) of the material. The physical ductility value has a value in a range of 0 to 1, which means that as the value is closer to 1, the material has more ductile characteristics.

$$\kappa = \frac{1-2v}{1+v} \quad \text{[Equation A]}$$

In Equation A, v is the Poisson's ratio of the material.

$$D=3x^2-2x^3 \quad \text{[Equation B]}$$

In Equation B, D is the physical ductility value, x is the value obtained by Equation $x=(1-\kappa)^2$, and κ is the value obtained in Equation A.

The black layer may comprise a material having the physical ductility value of 0.55 or more, where the material may be, for example, a metal. By applying such a material, it is possible to solve a problem that cracks occur in a process of forming a black layer or in the case where the substrate is bent depending on applications, and the like, or other defects occur. In another example, the physical ductility value may also be about 1 or less, about 0.95 or less, about 0.9 or less, about 0.85 or less, about 0.8 or less, about 0.75 or less, about 0.7 or less, or about 0.65 or less or so, and may also be about 0.6 or more. Such a material can be exemplified by, for example, gold (Au, physical ductility: about 0.93), lead (Pb, physical ductility: about 0.93), niobium (Nb, physical ductility: about 0.82), palladium (Pd, physical ductility: about 0.80), platinum (Pt, physical ductility: about 0.76), silver (Ag, physical ductility: about 0.73), vanadium (V, physical ductility: about 0.73), tin (Sn, physical ductility: about 0.69), aluminum (Al, physical ductility: about 0.65) or copper (Cu, physical ductility: about 0.62), and the like, but is not limited thereto.

The contents related to the black layer already described herein can be equally applied using a material having the physical ductility value of 0.6 or more.

For example, the metal layer, the metal oxide layer, the metal nitride layer, and/or the metal oxynitride layer can be formed using a metal having the physical ductility value of 0.6 or more, and the contents of whether a single layer or multilayers, thickness, other forms, and the like can also be applied equally.

The shape of the spacer formed together with the black layer is not particularly limited, as described above.

The spacer includes a curved portion. In one example, the spacer may be a hemispherical spacer where the curved portion is a hemispherical portion that is formed at least at the top end of the spacer. By applying the spacer having such a curved portion, even when orientation treatment such as rubbing orientation or photo-orientation is performed after an alignment film is formed on the base layer on which the spacer is formed, the uniform orientation treatment can be performed even in the region where the spacer exists without influence of the step by the spacer.

In the present application, the term curved portion may mean a part of the spacer including a curved shape in which the trajectory of the cross section has a predetermined curvature. In addition, the trajectory of the cross section of the curved portion may include a curved part where the center of curvature is present inside the cross-sectional trajectory.

In one example, the curved portion may have a maximum curvature of the cross-sectional trajectory of 2,000 $mm^{-1}$ or less. As is known, the curvature is a numerical value representing a degree of curvature of a line, which is defined as an inverse number of a radius of curvature which is a radius of a contact circle at a predetermined point of the relevant curve. In the case of a straight line, the curvature is 0, and the larger the curvature, the more curved the curve exists.

By controlling the degree of bending of the curved portion so that the maximum curvature of the cross-sectional trajectory of the hemispherical portion is 2,000 $mm^{-1}$ or less, the uniform orientation treatment can be performed even when the orientation treatment of the alignment film is performed at the top of the curved portion. Here, the cross section for confirming the cross-sectional trajectory of the hemispherical portion may be any normal plane for the base layer. In addition, the maximum curvature may mean the largest curvature among the curvatures for all the contact circles that can be obtained on the cross-sectional trajectory of the curved portion. In other words, the cross-sectional trajectory of the curved portion may not include the bent portion such an extent that the curvature exceeds 2,000 $mm^{-1}$.

In another example, the maximum curvature may be 1,800 $mm^{-1}$ or less, 1,600 $mm^{-1}$ or less, 1,400 $mm^{-1}$ or less, 1,200 $mm^{-1}$ or less, 1,000 $mm^{-1}$ or less, 900 $mm^{-1}$ or less, 950 $mm^{-1}$ or less, 800 $mm^{-1}$ or less, 750 $mm^{-1}$ or less, 700 $mm^{-1}$ or less, 650 $mm^{-1}$ or less, 600 $mm^{-1}$ or less, 550 $mm^{-1}$ or less, 500 $mm^{-1}$ or less, 450 $mm^{-1}$ or less, 400 $mm^{-1}$ or less, 350 $mm^{-1}$ or less, 300 $mm^{-1}$ or less, 250 $mm^{-1}$ or less, 200 $mm^{-1}$ or less, or 150 $mm^{-1}$ or less or so. In another example, the maximum curvature may be 5 $mm^{-1}$ or more, 10 $mm^{-1}$ or more, 15 $mm^{1}$ or more, 20 $mm^{-1}$ or more, 25 $mm^{-1}$ or more, 30 $mm^{-1}$ or more, 40 $mm^{-1}$ or more, 45 $mm^{-1}$ or more, or 50 $mm^{-1}$ or more.

The cross-sectional trajectory of the curved portion may or may not include a portion having curvature of 0, that is, a linear portion.

For example, FIG. 8 is an example of a cross-sectional trajectory of a curved portion (e.g., a hemispherical portion) that does not include a portion having curvature of 0, and FIG. 9 is an example of a cross-sectional trajectory of a curved portion including a portion having curvature of 0.

The spacer may comprise the curved portion as above at least at the top end of the spacer. The spacer may be formed in various shapes as long as it comprises the hemispherical portion. For example, the spacer may be a shape in which the curved portion is directly formed on the surface of the base layer (100), as shown in FIG. 8 or 9, or may be a columnar spacer including the curved portion at the top end, as shown in FIG. 10 or 11.

In the curved portion of the spacer, the cross-sectional trajectory may not include a portion having curvature of 0, as shown in FIG. 8 or 10, or the cross-sectional trajectory may also include a portion (a flat surface at the top end) having curvature of 0, as shown in FIG. 9 or 11. Hereinafter, for convenience, the curved portion of the same shape as that of a hemisphere in FIG. 8 or 10 may be referred to as a hemispherical portion, and the curved portion having a shape in which a flat surface is formed on the top end of the spacer in FIG. 9 or 11 may be referred to as a curved portion including a flat portion.

In FIGS. 8 to 11, H2 is the height of the curved portion, R is the radius of curvature of the curved portion, W1 is the length (width) of the flat surface of the flat portion, W2 is the width of the spacer, H1 is the value obtained by subtracting the height (H2) of the curved portion from the total height of the spacer.

The curved portion may be a complete hemispherical shape or may be one having an approximately hemispherical shape. The complete hemispherical shape may be a hemispherical shape satisfying Relational Expression 1 to be described below, and the approximate hemispherical shape may be a hemispherical shape satisfying any one of Relational Expressions 2 to 4 below.

The curved portion may have a shape in which the cross-sectional shape satisfies any one of Relational Expressions 1 to 4 below.

$$a=b=R \quad \text{[Relational Expression 1]}$$

$$a\neq b=R \text{ or } b\neq a=R \quad \text{[Relational Expression 2]}$$

$$a=b<R \quad \text{[Relational Expression 3]}$$

$$a\neq b<R \quad \text{[Relational Expression 4]}$$

In Relational Expressions 1 to 4, a is the horizontal length of the curved portion section measured at the center of the virtual contact circle of the curved portion section, b is the vertical length of the curved portion section measured at the center of the virtual contact circle of the curved portion section, and R is the curvature radius of the virtual contact circle of the curved portion section.

The curvature radius in Relational Expressions 1 to 4 corresponds to the length indicated by R in FIGS. 8 to 11.

In Relational Expressions 1 to 4, the virtual contact circle may mean a contact circle having the largest curvature radius among a plurality of virtual contact circles in contact with the curved line forming the curved portion.

If the curved portion is the complete hemispherical portion as shown in FIGS. 8 and 10, the cross section of the curved portion as a whole is a curved line, and thus a contact circle having the largest curvature radius among a plurality of virtual contact circles in contact with any point of the relevant curved line may be a contact circle as referred to in Relational Expressions 1 to 4. In addition, if the curved portion includes a flat portion as shown in FIGS. 9 and 11, a contact circle having the largest curvature radius among a plurality of virtual contact circles in contact with any point of both side curved lines excluding the flat line on the top in the curved portion section becomes a virtual contact circle as referred to in Relational Expressions 1 to 4.

In Relational Expressions 1 to 4, the horizontal length is a length measured in a direction horizontal to the base layer surface (Reference Numeral 100 in FIGS. 8 to 11) at the center point of the virtual contact circle, and the vertical length is a length measured in a direction vertical to the base layer surface (Reference Numeral 100 in FIGS. 8 to 11).

In Relational Expressions 1 to 4, a is the length from the center of the virtual contact circle of the curved portion section to the point where the hemispherical portion is terminated as measured while proceeding in the horizontal direction. This horizontal length may have two lengths of a length from the center of the virtual contact circle as measured while proceeding in the rightward direction and a length measured while proceeding in the leftward direction, where a applied in Relational Expressions 1 to 4 means a short length of the two lengths. In the case of the curved portion having a shape of FIGS. 8 and 10, the horizontal length (a) is a value corresponding to ½ of the width (W2) of the spacer. Also, in the case of FIGS. 9 and 11, the value (2a+W1) obtained by adding the length (width) (W1) of the flat portion to twice the horizontal length (a) may correspond to the width (W2) of the spacer.

In Relational Expressions 1 to 4, b is the length from the center of the virtual contact circle of the curved portion section to the point where the curved portion first meets while proceeding in the vertical direction. Usually, this vertical length (b) may be approximately the same as the height of the curved portion, for example, the length indicated by Symbol H2 in FIGS. 8 to 11.

FIG. 12 is a cross-sectional curve shape of the curved portion satisfying Relational Expression 1 above, which shows a case where the curved line of the curved portion has a complete circle curve, that is, a curve coinciding with the virtual contact circle.

Also, FIGS. 13 to 17 show approximate curve shapes of the curved portion satisfying any one of Relational Expressions 2 to 4.

A tapered portion, in which the cross-sectional trajectory is a curved shape that the curvature center is formed outside the cross section, may be formed at the bottom end of the spacer, for example, the bottom contacting the base layer side. With this form, an excellent effect according to the specific shape of the spacer of the present application, for example, achievement of the uniform orientation treatment or the like can be further improved.

The dimension of the spacer having the same shape as above is not particularly limited, which can be appropriately selected in consideration of, for example, a cell gap of the desired optical device or an aperture ratio, and the like.

For example, the height of the curved portion (H2 in FIGS. 8 to 11) may be in a range of 1 μm to 20 μm. In another example, the height may be 2 μm or more, 3 μm or more, 4 μm or more, 5 μm or more, 6 μm or more, 7 μm or more, 8 μm or more, 9 μm or more, 10 μm or more, or 11 μm or more. In another example, the height may also be 19 μm or less, 18 μm or less, 17 μm or less, 16 μm or less, 15 μm or less, 14 μm or less, 13 μm or less, 12 μm or less, or 11 μm or less.

In addition, the width of the curved portion (W2 in FIGS. 8 to 11) may be in a range of 2 μm to 40 μm. In another example, the width may be 4 μm or more, 6 μm or more, 8 μm or more, 10 μm or more, 12 μm or more, 14 μm or more, 16 μm or more, 18 μm or more, 20 μm or more, or 22 μm or more. In another example, the width may be 38 μm or less, 36 μm or less, 34 μm or less, 32 μm or less, 30 μm or less, 28 μm or less, 26 μm or less, 24 μm or less, or 22 μm or less.

When the spacer has the shape as shown in FIG. 8 or 9, the height of the spacer may be the same as the height of the curved portion, and when the spacer has the shape as shown in FIGS. 10 and 11, it may be a value obtained by adding the height (H1) of a columnar portion to the height of the curved portion. In one example, the height may be in a range of 1 μm to 50 μm.

In another example, the height may be 3 μm or more, 5 μm or more, 7 μm or more, 9 μm or more, 11 μm or more, 13 μm or more, 15 μm or more, 17 μm or more, 19 μm or more, 21 μm or more, 23 μm or more, 25 μm or more, or 27 μm or more. In another example, the height may be 48 μm or less, 46 μm or less, 44 μm or less, 42 μm or less, 40 μm or less, 38 μm or less, 36 μm or less, 34 μm or less, 32 μm or less, 30 μm or less, 28 μm or less, or 26 μm or less.

By controlling the dimension of the spacer including or not including a column portion as above, the uniform orientation treatment can be performed even with respect to the alignment film formed on the top of the spacer and the uniform cell gap can be maintained, and thus when the substrate has been applied to production of an optical device, the performance of the relevant device can be excellently maintained.

The spacer can be formed using, for example, a transparent resin, as described above. In one example, the spacer may be formed by comprising a transparent ultraviolet curable resin. For example, it may be formed by curing the ultraviolet curable compound in a state where the shape of the ultraviolet curable compound is maintained in a state capable of forming a desired shape by an imprinting method to be described below, where the ultraviolet curable resin, which is a cured product of the ultraviolet curable compound, can form the spacer. The specific kind of ultraviolet curable compound that can be used for forming the spacer is not particularly limited, and for example, an acrylate-based polymer material or an epoxy-based polymer, and the like may be used, without being limited thereto.

The substrate of the present application may comprise, in addition to the base layer and the spacers, other elements required for driving the optical device. These elements are variously known, and typically, there is an electrode layer or the like. FIG. 6 is an example of a structure in which an electrode layer (40) is formed between the black layer (30) and the base layer (10) in the substrate of the structure of FIG. 1, and FIG. 7 is an example of a structure in which an electrode layer (40) is formed between the black layer (30) and the base layer (10) in the substrate of the structure of FIG. 2.

As in the drawing, the substrate may further comprise an electrode layer between the base layer and the spacers. As the electrode layer, a known material can be applied. For example, the electrode layer may comprise a metal alloy, an electrically conductive compound or a mixture of two or more thereof. Such a material can be exemplified by a metal such as gold, CuI, an oxide material such as ITO (indium tin oxide), IZO (indium zinc oxide), ZTO (zinc tin oxide), zinc oxide doped with aluminum or indium, magnesium indium oxide, nickel tungsten oxide, ZnO, $SnO_2$ or $In_2O_3$, a metal nitride such as gallium nitride, a metal selenide such as zinc selenide, a metal sulfide such as zinc sulfide, or the like. A transparent positive hole injecting electrode layer can also be formed by using a laminate of a metal thin film of Au, Ag or Cu, and the like, and a transparent material having high refractive index such as ZnS, $TiO_2$ or ITO.

The electrode layer may be formed by any means such as vapor deposition, sputtering, chemical vapor deposition or electrochemical means. Patterning of the electrode layer is also possible in a known manner without any particular limitation, and the electrode layer may be patterned, for example, through known photolithography or a process using a shadow mask or the like.

The substrate of the present application may further comprise an alignment film present on the base layer and the spacer.

Thus, another exemplary substrate of the present application may comprise a base layer; a spacer present on the base layer; and an alignment film formed on the base layer and the spacer.

Here, the details of the base layer and the spacer are as described above. In addition, the kind of the alignment film formed on the base layer and the spacers is not particularly limited, where a known alignment film, for example, a known rubbing alignment film or a photo-alignment film can be applied. A method of forming the alignment film on the base layer and the spacers and performing orientation treatment thereon is also in accordance with a known method.

The base layer may comprise a plurality of spacers by comprising, including the spacer as mentioned above, the same or different spacers. Such a plurality of spacers may be disposed on the base layer while having predetermined regularity and irregularity simultaneously. Specifically, at least a part of the plurality of spacers on the base layer may be in an irregular arrangement in terms of being arranged so as to have pitches different from each other, but may be regular in terms of being arranged with substantially the same density between regions determined according to a predetermined rule.

That is, in one example, at least a part of the spacers disposed on the base layer may be disposed so as to have pitches different from each other.

Here, when a part of the plurality of spacers have been selected so as to form a closed figure in a state where other spacers are not present therein, the term pitch can be defined as a length of a side of the closed figure. In addition, unless otherwise specified, the unit of the pitch is μm.

The closed figure thus formed may be a triangle, a quadrangle or a hexagon. That is, when three spacers among the plurality of spacers have been optionally selected and connected to each other, the triangle is formed; when four spacers have been selected and connected to each other, the quadrangle is formed; and when six spacers have been selected and connected, the hexagon is formed. However, upon determining the pitch, the closed figure thus formed is formed such that no spacer is present therein, and thus, for example, in the case where spacers are selected such that another spacer is present therein, they are excluded when determining the pitch.

In one example, the ratio (%) of the number of sides having the same length among sides of a triangle, a quadrangle or a hexagon, which is the closed figure thus formed (100×(number of sides of the same length)/3 in the case of a triangle, 100×(number of sides of the same length)/4 in the case of a hexagon, and 100×(number of sides of the same length)/6 in the case of a hexagon) can be 85% or less. In another example, the ratio may be 84% or less, 80% or less, 76% or less, 67% or less, 55% or less, or 40% or less. The lower limit of the ratio is not particularly limited. That is, in some cases, since the lengths of all sides of the closed figure may not be the same, the lower limit of the ratio may be 0%.

As described above, the arrangement of the spacers of the present application is irregular in that at least a part thereof has different pitches, but such irregularity is controlled under certain regularity. Here, the regularity may mean that the arrangement density of spacers is substantially close to each other between certain regions.

For example, if the normal pitch of the plurality of irregularly arranged spacers is P, when two or more square regions with 10P as a length of one side have been optionally selected on the surface of the base layer, the standard deviation of the number of spacers present in each square region is 2 or less.

The term normal pitch means a distance between the centers of adjacent spacers in a state where the plurality of spacers, in actuality, irregularly disposed on the base layer are placed so that all of the spacers are virtually disposed at the same pitch in consideration of the number of the spacers and the area of the base layer.

The manner to confirm a virtual state where all of the above-mentioned spacers are disposed so as to have the same pitch is known, which can be achieved by using a random number generating program such as, for example, CAD, MATLAB, STELLA or Excel.

In addition, the standard deviation is a numerical value representing a degree of scattering of the number of the spacers, which is a numerical value determined by a positive square root of dispersion.

That is, when at least two or more of the rectangular regions have been optionally designated on the surface of the base layer that spacers are formed thereon and then the standard deviation of the numbers of spacers existing in the regions has been obtained, the standard deviation is 2 or less. In another example, the standard deviation may be 1.5 or less, 1 or less, or 0.5 or less. In addition, the standard deviation means that the lower the numerical value is, the desired regularity is achieved, and thus the lower limit is not particularly limited, which may be 0, for example.

Also, here, the number of the designated rectangular regions is not particularly limited as long as it is 2 or more, but in one example, it may be selected as the number that the rectangular regions are optionally selected so as not to overlap each other on the surface of the base layer, provided that the area occupied by the optionally selected regions is about 10% or more, 20% or more, 30% or more, 40% or more, 50% or more, 60% or more, 70% or more, 80% or more, or 90% or more of the total area of the base layer.

Furthermore, the range of the normal pitch (P) forming one side of the arbitrary rectangular region can be determined by the number of spacers present on the base layer and the area of the relevant base layer, as described above, which is not particularly limited, and usually, it may be determined in a range of 100 μm to 1,000 μm.

Although not particularly limited, the average number of spacers present in optionally selected square regions as above may be, for example, about 80 to 150 or so. In another example, the average number may be 82 or more, 84 or more, 86 or more, 88 or more, 90 or more, 92 or more, 94 or more, 96 or more, or 98 or more. Also, in another example, the average number may be 148 or less, 146 or less, 144 or less, 142 or less, 140 or less, 138 or less, 136 or less, 134 or less, 132 or less, 130 or less, 128 or less, 126 or less, 124 or less, 122 or less, 120 or less, 118 or less, 116 or less, 114 or less, or 112 or less.

Also, the ratio (SD/A) of the average number (A) of the spacers and the above-mentioned standard deviation (SD) may be 0.1 or less. In another example, the ratio may be 0.09 or less, 0.08 or less, 0.07 or less, 0.06 or less, 0.05 or less, 0.04 or less, or 0.03 or less.

The average number (A) or the ratio (SD/A) may be optionally changed, and for example, the numerical value may be changed in consideration of the transmittance, the cell gap and/or the uniformity of the cell gap required in the device to which the substrate is applied, and the like.

In another example, when the surface of the base layer on which the irregularly disposed spacers are formed has been divided into two or more regions having the same area, the standard deviation of the number of the spacers in each unit region may be 2 or less.

Here, the meaning of the standard deviation and the specific examples thereof are as described above.

That is, in the example, when the base layer has been divided into at least two regions having the same area and the standard deviation of the number of the spacers present in each divided unit region has been obtained, the standard deviation thereof is 2 or less. In this case, the shape of each divided unit region is not particularly limited as long as the relevant unit regions are divided so as to have the same area, but it may be, for example, a triangular, square, or hexagonal region. In addition, in another example, the standard deviation in the above state may be 1.5 or less, 1 or less, or 0.5 or less, and the lower limit thereof is not particularly limited, as described above, which may be 0, for example.

Here, the number of unit regions is not particularly limited, but in one example, the base layer may be divided into two or more, four or more, six or more, eight or more, or ten or more regions having the same area. Here, since it means that the higher the number of the divided regions, the more uniform the density of the spacers is maintained, the upper limit of the number of divided regions is not particularly limited.

When the virtual square region with P, which is a normal pitch, as one side has been selected on the substrate on which the plurality of spacers are disposed so as to have regularity and irregularity simultaneously, the average number of spacers existing in the relevant region may be in a range of 0 to 4. In another example, the average number may be 3.5 or less, 3 or less, 2.5 or less, 2 or less, or 1.5 or less. Also, in another example, the average number may be 0.5 or more. Here, the number of square regions of which the length of one side is optionally designated as the normal pitch (P) is not particularly limited as long as it is two or more, but in one example, it may be selected as the number that the square regions are optionally selected so as not to overlap each other on the surface of the base layer, provided that the area occupied by the optionally selected region is about 10% or more, 20% or more, 30% or more, 40% or more, 50% or more, 60% or more, 70% or more, 80% or more, or 90% or more of the total area of the base layer.

The entire density of the plurality of spacers can be adjusted so that the ratio of the area occupied by the spacers is about 50% or less relative to the total area of the base layer. In another example, the ratio may be about 45% or less, about 40% or less, about 35% or less, about 30% or less, about 25% or less, about 20% or less, about 15% or less, about 10% or less, about 9.5% or less, 9% or less, 8.5% or less, 8% or less, 7.5% or less, 7% or less, 6.5% or less, 6% or less, 5.5% or less, 5% or less, 4.5% or less, 4% or less, 3.5% or less, 3% or less, 2.5% or less, 2% or less, or 1.5% or less. In another example, the ratio may be about 0.1% or more, 0.2% or more, 0.3% or more, 0.4% or more, 0.5% or more, 0.6% or more, 0.7% or more, 0.8% or more, 0.9% or more, or 0.95% or more.

When an optical device has been implemented by disposing a plurality of spacers on the base layer in the above form, the uniform optical characteristics can be ensured without causing the so-called moire phenomenon, while the spacers maintain the uniform pitch (cell gap) between the substrates.

The respective numerical values may be changed, if necessary, and for example, the numerical values may be changed in consideration of the transmittance, the cell gap and/or the uniformity of the cell gap required in the device to which the substrate is applied, and the like.

The plurality of spacers may be arranged such that their spacing normal distribution diagram represents a predetermined shape.

Here, the spacing normal distribution diagram is a distribution diagram showing the pitch between the spacers as the X-axis and the ratio of the spacers having the relevant pitch among all the spacers as the Y-axis, where the ratio of the spacers is a ratio obtained when the number of the entire spacer has been 1.

The pitch in the description related to the spacing normal distribution diagram herein is a length of sides in a triangle, a quadrangle or a hexagon, which is the above-mentioned closed figure.

The distribution diagram can be obtained using a known random number coordinate program, for example, a CAD, MATLAB or STELLA random number coordinate program or the like.

In one example, the plurality of spacers may be disposed such that a half height area in the distribution diagram is in a range of 0.4 to 0.95. In another example, the half height area may be 0.6 or more, 0.7 or more, or 0.85 or more. Also, in another example, the half height area may be 0.9 or less, 0.85 or less, 0.8 or less, 0.75 or less, 0.7 or less, 0.65 or less, 0.6 or less, 0.55 or less, or 0.5 or less.

The plurality of spacers may be arranged such that a ratio (FWHM/Pm) of the half height width (FWHM) to the average pitch (Pm) in the distribution diagram is 1 or less. In another example, the ratio (FWHM/Pm) may be 0.05 or more, 0.1 or more, 0.11 or more, 0.12 or more, or 0.13 or more. Also, in another example, the ratio (FWHM/Pm) is about 0.95 or less, about 0.9 or less, about 0.85 or less, about 0.8 or less, about 0.75 or less, about 0.7 or less, about 0.65 or less, about 0.6 or less, about 0.55 or less, about 0.5 or less, about 0.45 or less, or about 0.4 or less.

When at least 80% or more, 85% or more, 90% or more, or 95% or more of spacers have been selected to form a triangle, quadrangle or hexagon, which is the above-described closed figure, the above-mentioned average pitch (Pm) is an average of the lengths of the respective sides of the triangle, quadrangle or hexagon formed by the selected spacers. Here, the spacers are also selected so that the formed triangles, quadrangles or hexagons do not share vertexes with respect to each other.

The plurality of spacers may be disposed such that the half height width (FWHM) in the distribution diagram is in a range of 0.5 μm to 1,000 m. In another example, the half height width (FWHM) may be about 1 μm or more, 2 μm or more, 3 μm or more, 4 μm or more, 5 μm or more, 6 μm or more, 7 μm or more, 8 μm or more, 9 μm or more, 10 μm or more, 11 μm or more, 12 μm or more, 13 μm or more, 14 μm or more, 15 μm or more, 16 μm or more, 17 m or more, 18

μm or more, 19 μm or more, 20 μm or more, 21 μm or more, 22 μm or more, 23 μm or more, or 24 μm or more. In another example, the half height width (FWHM) may be about 900 μm or less, 800 μm or less, 700 μm or less, 600 μm or less, 500 μm or less, 400 μm or less, 300 μm or less, 200 μm or less, 150 μm or less, 100 μm or less, 90 μm or less, 80 μm or less, 70 μm or less, 60 μm or less, 50 μm or less, 40 μm or less, or 30 μm or less.

The plurality of spacers may be disposed such that the maximum height (Fmax) of the spacing normal distribution diagram is 0.006 or more and less than 1. In another example, the maximum height (Fmax) may be about 0.007 or more, about 0.008 or more, about 0.009 or more, or about 0.0095 or more. Also, in another example, the maximum height (Fmax) may be about 0.9 or less, about 0.8 or less, about 0.7 or less, about 0.6 or less, about 0.5 or less, about 0.4 or less, about 0.3 or less, about 0.2 or less, about 0.1 or less, about 0.09 or less, about 0.08 or less, about 0.07 or less, about 0.06 or less, about 0.05 or less, about 0.04 or less, about 0.03 or less, or about 0.02 or less.

When an optical device has been implemented by disposing a plurality of spacers on to have the spacing normal distribution diagram in such a form, the uniform optical characteristics can be ensured without causing the so-called moire phenomenon, while the spacers maintain the uniform pitch (cell gap) between the substrates.

The concept of degree of irregularity is introduced for a plurality of spacers to be disposed so as to simultaneously have irregularity and regularity as above. Hereinafter, a method for designing the arrangement of the spacers having such a form will be described.

In order to achieve the arrangement of the spacers having the above-mentioned regularity and irregularity simultaneously, a step of starting from a normal arrangement state and relocating the spacers to have irregularity is performed.

Here, the normal arrangement state is a state where the plurality of spacers are disposed on the base layer such that a regular triangle, a square or a regular hexagon in which all sides have the same length can be formed. FIG. 18 is a state in which spacers are disposed to form the square as an example. The length P of one side of the square in this state may be equal to the above-mentioned normal pitch. In such an arrangement state, a circle region having a radius of a length proportional to the length P of one side is designated on the basis of a point where one spacer exists, and the program is set so that the one spacer can be randomly moved in the region. For example, FIG. 18 schematically shows a form in which the circle region having the radius of the length of 50% (0.5P) relative to the length P is set and the spacer moves to any point in the region. The above-described arrangement can be achieved by applying such a movement to spacers of at least 80% or more, 85% or more, 90% or more, 95% or more, or 100% (all spacers).

In such a design method, the ratio for the length P which becomes the radius of the circle region may be defined as a degree of irregularity. In one example, the degree of irregularity in the design manner may be about 5% or more, about 10% or more, about 15% or more, about 20% or more, about 25% or more, about 30% or more, about 35% or more, about 40% or more, about 45% or more, about 50% or more, about 55% or more, about 60% or more, or about 65% or more. In one example, the degree of irregularity may be about 95% or less, about 90% or less, about 85% or less, or about 80% or less.

The arrangement having the above-described irregularity and regularity simultaneously can be achieved by designing the arrangement of the spacers in the same manner as above and forming the spacers according to the designed arrangement.

Also, here, although the case where the normal state starts from the square has been exemplified, the normal state may be other figures such as a regular triangle or a regular hexagon, and in this case, the above-described arrangement can also be achieved.

Furthermore, the means for designing the arrangement of the spacers in the same manner as above is not particularly limited, and a known random number coordinate program such as, for example, a CAD, MATLAB, STELLA or Excel random number coordinate program can be used.

For example, after the arrangement of the spacers is first designed in the same manner as above, a mask having a pattern according to the relevant design and the like may be manufactured, and such spacers may be implemented by applying the relevant mask to the above-described lithography or imprinting method, and the like.

The substrate can be produced through processes of light irradiation using an imprinting mask containing a light-shielding layer, development of an uncured resin layer, and etching of a black layer, and the like. By applying such a method, it is possible to produce a substrate, having excellent adhesiveness, of a desired structure without adverse effects such as occurrence of foreign materials by a simple process.

FIG. 19 is a diagram schematically showing a process of producing such a substrate. As in FIG. 19, in a state of forming the black layer (2000) and the uncured resin layer (3001) to form spacers on the surface of the base layer (1000), an imprinting mask containing a light-shielding layer is pressed thereon. The imprinting mask containing a light-shielding layer may have a form in which a light-shielding film (902) is patterned on the surface of the light-transmissive main body (901) as in FIG. 19. Here, the pattern of the light-shielding film (902) is determined depending on the pattern shape of the desired spacer. If necessary, the surface of the main body (901) on which the pattern of the light-shielding film (902) is formed may be subjected to appropriate mold releasing treatment.

In this state, the uncured resin layer (3001) on the light-shielding mask is irradiated with light. By such irradiation, the resin layer (3001) in the portion where the light-shielding film (902) is not formed in the light-shielding mask is irradiated with light and cured, and the resin layer (3001) under the light-shielding film (902) is not cured. In the drawing, uncured parts are indicated by dots. Subsequently, the uncured resin layer is removed in an appropriate manner, and this process is referred to as developing. Subsequently, after the developing, the substrate having the above structure can be produced by removing the black layer at the part where the resin layer has been removed by the developing.

The light-shielding masks that can be used in the above process vary, and one example thereof is shown in FIG. 20. The mask of FIG. 20 has a form that a concave hemispherical shape (9011) is formed on one surface of a light-transmissive main body (for example, ultraviolet-transmissive main body), and the light-shielding film (902) is formed on a portion where the hemispherical shape is not formed on the surface on which the hemispherical shape (9011) is formed. As shown in the drawing, the hemispherical shape (9011) may be produced by forming an imprinting mold (901) on one side of the main body (9) of the imprinting mask and forming the hemispherical shape (9011) and the light-shielding film (902) on the mold (901). If necessary, the surface of the mold (901) on which the light-shielding film (902) is formed may be subjected to appropriate mold releasing treatment. Here, the shape of the concave portion (9011) is determined depending on the shape of the desired spacer, which is not particularly limited. In an example of FIG. 20, the concave portion has a hemispherical shape.

FIG. 21 is an example of performing the process shown in FIG. 19 using the mask shown in FIG. 20. A curable resin layer (200) such as an ultraviolet curable type is first formed on the surface of the base layer (100) and the mask (900) is pressed on the resin layer (200). Then, if the resin layer (200) is cured by irradiating the top of the mask (900) with ultraviolet rays or the like, the resin layer is cured according to the shape of the concave portion (9011) formed on the mask (900), whereby a spacer may be formed and subsequently, the above-described developing and etching processes may proceed.

When the pressing process is performed by applying the imprinting mask on which the concave portion (9011) or the like is formed as in FIGS. 19 and 21, the penetration of foreign materials such as oxygen into the resin layer, which is cured in the curing process, becomes difficult, so that the curing can be performed more effectively.

Therefore, in one example, the imprinting mask containing a light-shielding layer may comprise a light-transmissive main body that a concave portion is formed on one surface thereof and a light-shielding film existing in a portion of the main body where the concave portion is not formed.

The materials of the main body and the light-shielding film for forming such a mask and the production method thereof may follow a known manner.

Generally, in the production process of the optical device, an alignment film is additionally formed on the spacer surface of the substrate formed in the same manner as above. There are various kinds of alignment films, but for example, when a normal rubbing alignment film is formed, physical contact such as rubbing is applied to the substrate surface during the formation process of the alignment film. If the sticking force between the spacers and the black layer is not ensured properly in this process, there is a problem that the spacers formed once are lost due to the external force due to the physical contact. Therefore, additional processing is required to increase the sticking force between the resin layer and the black layer, and generally, such a treatment includes a heat treatment process for applying appropriate heat to the substrate between the developing process and the etching process. As a method for enhancing adhesive force between the resin layer and the black layer without the heat treatment process, for example, a method of increasing a light quantity or the like in the ultraviolet ray irradiation process to enhance the degree of curing of the resin layer may be considered. However, the present inventors have confirmed that there is a problem that foreign materials remain on a substrate of a spacer pattern or the like in a method of simply enhancing only the degree of curing.

However, the present applicant has confirmed that by controlling the light quantity upon light irradiation together with the pressing speed of the mask in the above process, the high adhesive force between the black layer and the resin layer can be ensured while preventing occurrence of foreign materials even when the above-described heat treatment process is omitted, if necessary.

A production method of a substrate of the present application comprises a process of pressing an imprinting mask containing a light-shielding layer on a resin layer of a laminate comprising a base layer; a black layer formed on the base layer and a light curable resin layer formed on the black layer and simultaneously irradiating the resin layer on the mask with light.

In the production method of the present invention, the pressing speed of the imprinting mask containing the light-shielding layer is controlled to 0.3 mpm (meters per minute) or more and the light quantity of the irradiated light is controlled to 300 mJ/cm$^2$ or more. Through this control, the object of the present application can be achieved.

Here, the pressing speed of the mask can be achieved by controlling the speed at which the light-shielding mask is covered and pressed onto the resin layer in the continuous process of pressing the light-shielding mask on the resin layer formed on the black layer and simultaneously irradiating it with light. For example, if the process is performed by a roll-to-roll method or a roll imprinting method, the pressing speed can be controlled by controlling the movement speed of the resin layer and/or the rotation speed of the roll on which the mask is formed, and the like. The present inventors have confirmed that the height of the residual film of the resin layer increases as the pressing speed increases and the elevated residual film facilitates the foreign materials that may be present on the base layer surface or the resin layer to escape to the outside of the pressing region.

The pressing speed of the mask helps to remove foreign materials by increasing the height of the residual film as the speed is higher, where the upper limit is not particularly limited. The speed may be, for example, about 2 mpm or less, 1.5 mpm or less, 1 mpm or less, 0.8 mpm or less, 0.6 mpm or less, or 0.5 mpm or less or so, but is not limited thereto.

The resin layer can be cured by irradiating the resin layer with light through the mask while pressing the mask in the same manner as above. At this time, the wavelength of the light to be irradiated is determined depending on the kind of the resin layer, which is not particularly limited, and in general, ultraviolet rays in a wavelength range of about 300 to 400 nm can be applied. At this time, the light quantity of the irradiated light can be adjusted to about 300 mJ/cm$^2$ or more. Such a light quantity range can be made in connection with the above-mentioned pressing speed, so that a spacer having excellent adhesiveness to a good black layer can be formed without foreign materials. In another example, the light quantity may be about 350 mJ/cm$^2$ or more, about 400 mJ/cm$^2$ or more, about 450 mJ/cm$^2$ or more, about 500 mJ/cm$^2$ or more, about 550 mJ/cm$^2$ or more, about 600 mJ/cm$^2$ or more, about 650 mJ/cm$^2$ or more, or about 685 mJ/cm$^2$ or more or so. The larger the value of the light quantity, the higher the adhesiveness can be secured, where the upper limit is not particularly limited, but for example, it may be about 2,000 mJ/cm$^2$ or less, about 1,500 mJ/cm$^2$ or less, about 1,000 mJ/cm$^2$ or less, about 800 mJ/cm$^2$ or less, or about 750 mJ/cm$^2$ or less or so.

The production method of the present application may further comprise a process of developing the resin layer following the above process and etching the black layer after developing the resin layer. In the developing process of the resin layer, the irradiated light is shielded by the light-shielding film of the light-shielding mask, whereby the uncured portion can be removed. The developing process can be performed by a known manner, and for example, the developing process can be performed using a treating agent known to be capable of removing the uncured resin layer, where as the treating agent, a developer having an amine ($NH_3$) and a hydroxyl group (OH) is known. The developing process can be performed through appropriate treatment using the developer as above, and for example, the developing process can be performed by applying the developer in a spray developing manner at a pressure of about 2 bar or more and in a temperature range of 20° C. to 50° C.

The black layer can be removed by the etching process following the developing process. By this process, the black layer existing in the portion where the resin layer has been removed by the developing can be removed. The etching process can be performed by a known manner, and for example, it can be performed by treating the substrate with an etchant such as phosphoric acid, nitric acid, and acetic acid or an etchant mixed with two or more of the foregoing. The etching process may be performed at a temperature range of about 40° C. to 50° C. for 30 seconds to 30 minutes or so, but the specific processing conditions may be changed.

As described above, according to the production method of the present application, it is possible to produce a substrate having excellent characteristics without a separate step such as a heat treatment process for improving adhesiveness between the resin layer (spacer) and the black layer.

Accordingly, the production method of the present application may not perform the heat treatment process between the developing process and the black layer etching process.

The manner in which the respective processes are performed is not particularly limited and may be performed according to a known manner other than performing the control of the pressing speed and the light quantity.

In addition, the kinds and shapes of the base layer, the black layer, the spacer material, and the like applied in the above process are as described above.

Furthermore, as the applied spacer material, for example, a mixture of various acrylate compounds and an initiator may be used.

As the acrylate compound, one or a mixture of two or more of acrylate compounds such as a monofunctional acrylate such as methyl (meth)acrylate, ethyl (meth)acrylate, n-propyl (meth)acrylate, isopropyl (meth)acrylate, n-butyl (meth)acrylate, t-butyl (meth)acrylate, sec-butyl (meth) acrylate, pentyl (meth)acrylate, 2-ethylhexyl (meth)acrylate, 2-ethylbutyl (meth)acrylate, n-octyl (meth)acrylate, isobornyl (meth)acrylate, isooctyl (meth)acrylate, isononyl (meth) acrylate, lauryl (meth)acrylate, 2-hydroxyethyl (meth)acrylate, hydroxyalkyl (meth)acrylate of 2-hydroxypropyl (meth)acrylate, 4-hydroxybutyl (meth)acrylate, 6-hydroxyhexyl (meth)acrylate or 8-hydroxyoctyl (meh)acrylate, and the like, or hydroxyalkylene glycol (meth)acrylate of 2-hydroxyethylene glycol (meth)acrylate or 2-hydroxypropylene glycol (meth)acrylate, and the like and/or a multifunctional acrylate such as a bifunctional acrylate such as 1,4-butanediol di(meth)acrylate, 1,6-hexanediol di(meth)acrylate, neopentyl glycol di(meth)acrylate, polyethylene glycol di(meth) acrylate, neopentylglycol adipate di(meth)acrylate, hydroxypivalic acid neopentyl glycol di(meth)acrylate, dicyclopentanyl di(meth)acrylate, caprolactone modified dicyclopentenyl di(meth)acrylate, ethylene oxide modified di(meth)acrylate, di(meth)acryloxyethyl isocyanurate, allylated cyclohexyl di(meth)acrylate, tricyclodecane dimethanol (meth)acrylate, dimethylol dicyclopentane di(meth) acrylate, ethyleneoxide modified hexahydrophthalic acid di(meth)acrylate, tricyclodecane dimethalol (meth)acrylate, neopentyl glycol modified trimethylpropane di(meth)acrylate, adamantane di(meth)acrylate or 9,9-bis[4-(2-acryloyloxyethoxy)phenyl]fluorene; a trifunctional acrylate such as trimethylolpropane tri(meth)acrylate, dipentaerythritol tri (meth)acrylate, propionic acid modified dipentaerythritol tri(meth)acrylate, pentaerythritol tri(meth)acrylate, propyleneoxide modified trimethylolpropane tri(meth)acrylate, trifunctional urethane (meth)acrylate or tris(meth)acryloxyethyl isocyanurate; a tetrafunctional acrylate such as diglycerin tetra(meth)acrylate or pentaerythritol tetra(meth) acrylate; a pentafunctional acrylate such as propionic acid-modified dipentaerythritol penta(meth)acrylate; and a hexafunctional acrylate such as dipentaerythritol hexa(meth) acrylate, caprolactone modified dipentaerythritol hexa (meth)acrylate or a reactant of urethane (meth)acrylate (ex. isocyanate monomer) and trimethylolpropane tri(meth)acrylate, urethane acylate, epoxy acrylate, polyester acrylate or polyether acrylate, may be used.

Such a substrate formed by the method of the present application can be applied to various applications, where a representative application can be exemplified by formation of an optical device.

An exemplary optical device of the present application may comprise the substrate and a second substrate disposed opposite to the substrate and maintaining a gap with the substrate by the spacer in the substrate.

In the optical device, a light modulation layer may be present in a gap between two substrates. In the present application, the term light modulation layer may include all known types of layers capable of changing at least one characteristic among characteristics such as polarization states, transmittance, color tones and reflectance of incident light depending on purposes.

For example, the light modulation layer is a layer comprising a liquid crystal material, which may be a liquid crystal layer switched between a diffusion mode and a transparent mode by on-off of a voltage, for example, a vertical electric field or a horizontal electric field, a liquid crystal layer switched between a transparent mode and a blocking mode, a liquid crystal layer switched between a transparent mode and a color mode, or a liquid crystal layer switched between color modes of different colors.

The light modulation layers capable of performing the actions as above, for example, liquid crystal layers, are variously known. As one exemplary light modulation layer, a liquid crystal layer used in a typical liquid crystal display can be used. In another example, the light modulation layer may also be various types of so-called guest host liquid crystal layers, polymer dispersed liquid crystal layers, pixel-isolated liquid crystal layers, suspended particle devices or electrochromic devices, and the like.

The polymer dispersed liquid crystal layer (PDLC) is a superordinate concept including a PILC (pixel isolated liquid crystal), a PDLC (polymer dispersed liquid crystal), a PNLC (polymer network liquid crystal) or a PSLC (polymer stabilized liquid crystal), and the like. The polymer dispersed liquid crystal layer (PDLC) may comprise, for example, a liquid crystal region containing a polymer network and a liquid crystal compound dispersed in a state of being phase-separated from the polymer network.

The implementation manner or form of the light modulation layer is not particularly limited, and any known method may be employed without any limitation depending on purposes.

In addition, the optical device may further comprise additional known functional layers, such as a polarizing layer, a hard coating layer and/or an antireflection layer, if necessary.

Advantageous Effects

The present application provides a substrate and a method for producing the same. The present application can provide, in a substrate having a structure including a base layer, a black layer and a spacer, which are sequentially formed, a substrate having excellent adhesiveness of the spacer to the base layer or the black layer and ensuring appropriate darkening properties, and can also provide a production method capable of effectively producing such a substrate without adverse effects such as occurrence of foreign materials without separate treatment such as heat treatment.

MODE FOR INVENTION

Hereinafter, the present application will be specifically described by way of examples, but the scope of the present application is not limited by the following examples.

Example 1

A mask of the type as shown in FIG. 20 was produced and spacers were produced using the same. According to the form shown in FIG. 20, the mask was produced by forming concave portions (9011) on a PET (poly(ethylene terephthalate)) main body (9) through an imprinting mold (901), forming a light-shielding layer (AlOxNy) (902) on the surface on which no concave portion (9011) was formed and then forming a release layer on the light-shielding layer (902) and the concave portions (9011). At this time, the concave portion was formed into a hemispherical shape having a width in a range of approximately 24 μm to 26 μm, and approximately 9 μm to 10 μm or so. In addition, the concave portions were formed such that the arrangement of the spacers was such that the degree of irregularity according to an example described in FIG. 18 was about 70% or so.

A crystalline ITO (indium tin oxide) electrode layer was formed on a PC (polycarbonate) base layer, and a black layer was formed thereon.

The black layer was formed into a three-layer structure (AlON/Al/AlON) having the total thickness of about 200 nm or so by depositing aluminum oxynitride (AlON), aluminum (Al) and aluminum oxynitride (AlON) to thicknesses of about 60 nm, 80 nm and 60 nm or so, respectively. Here, aluminum is a metal whose physical ductility value is known to be approximately 0.62 or so.

Subsequently, about 2 to 3 mL of a mixture (UV resin) of a conventional ultraviolet curable acrylate binder and an initiator used in production of a column spacer was dropped on the black layer, and while the dropped mixture was pressed with the imprinting mask, ultraviolet rays were irradiated to cure the UV resin layer. Here, as the binder, a binder of acrylate series was used as a known binder for column spacers, where a binder obtained by mixing a monofunctional acrylate such as hydroxyethyl acrylate, isobornyl acrylate, methyl methacrylate or cyclohexyl acrylate and a multifunctional acrylate such as HMDA (1,6-hexanediol diacrylate), TMPTA (trimethylolpropane triacrylate) or PETTA (pentaerythritol tetraacrylate), and the like with D-1173, D-TPO, Igacure 184 or the like as an initiator in a weight ratio of 85-95:15-5 (acrylate compounds: initiator) was used.

Also, the above process was performed by a roll imprinting method performed in a state where the mask was mounted on a roll.

In the above process, the pressing speed of the mask was adjusted to about 0.3 mpm or so and the ultraviolet irradiation was performed by being irradiated with ultraviolet rays having a wavelength range of about 300 to 400 nm at a light quantity of about 418 mJ/cm$^2$.

Thereafter, the uncured UV resin layer (200) was removed (developed) with a developer having an amine ($NH_3$) and a hydroxyl group (OH) and by a spray developing method under a condition of a pressure of about 2 bar and a temperature of 30° C., and the black layer of the part, where the uncured UV resin layer was removed, was subjected to etching at a temperature of about 40° C. to 50° C. for about 1 minute or so using a mixed etchant of phosphoric acid, nitric acid and acetic acid, and removed (etched) to form spacers on the ITO electrode layer and the black layer of the PC base layer.

FIGS. 22A-B illustrate top down and side views, respectively, of scanning electron microscopy (SEM) images of a substrate and of the spacers arranged on the substrate produced by such a method and their arrangement state (irregularity degree 70%).

The adhesiveness between the spacers produced as above and the black layer was evaluated by the following peel test. A pressure-sensitive adhesive tape (Nichiban Tape, CT-24) (peel force: 3.72 to 4.16 N/10 mm, peel angle: 180 degrees, JIS Z 1522 standard) was formed on the surface of the substrate, on which the spacers were formed, with a rectangular attachment area of about 24 mm in width and about 40 mm in length. At the time of attachment, it was attached by applying a load of about 200 g on the pressure-sensitive adhesive tape using a roller. Thereafter, the pressure-sensitive adhesive tape was peeled off in the longitudinal direction using a tensile tester at a peeling speed of about 30 mm/s and a peel angle of 180 degrees. FIG. 23 is a view confirming whether or not the spacers are lost after the peeling.

The disappearance of the pattern was further observed with an optical microscope (Olympus BX 51) at a magnification of 50 times (eyepiece lens 10 times×objective lens 5 times) and confirmed. Five arbitrary regions were selected from the total attachment area (24 mm×40 mm) to determine the disappearance, and the degree of loss of the pattern was calculated via the average value. The calculation of pattern attachment force was evaluated by introducing the cross-cut method of ASTM D3359 and setting 100×the number of non-lost spacer patterns/the number of the entire pattern before measuring attachment force as attachment force (pattern retention rate), and as a result of evaluation, the attachment force was in a level of more than about 85% (pattern loss rate: 15% or less). FIG. 24 is the result of confirming whether or not foreign materials occur in the above process, and it can be confirmed from FIG. 24 that the process can proceed without occurrence of foreign materials. The pattern loss rate is a value obtained by subtracting the pattern retention rate from 100.

Example 2

Spacers were manufactured in the same manner as in Example 1, provided that the spacers were produced by setting the pressing speed to about 0.4 mpm or so and adjusting the light quantity to about 685 mJ/cm$^2$ or so. FIG. 25 shows the result of confirming the foreign material characteristics in the process of producing the spacer, FIG. 26 is the result of confirming whether or not the patterns are lost in the same manner as in Example 1, and FIG. 27 is an OM image after forming a known alignment film on the produced substrate and performing rubbing treatment thereon.

It can be confirmed from FIGS. 25 to 27 that according to the method of the present application, there is no foreign material during the process and a substrate having excellent adhesiveness of the spacer to the black layer is produced. In addition, the pattern retention rate of the substrate measured by the same peel test as in Example 1 was in a level of more than about 85% (pattern loss rate: 15% or less).

Comparative Example 1

A spacer-containing substrate was produced in the same manner, except that in the process of Example 1, the irradiation light quantity of ultraviolet rays was adjusted to about 240 mJ/cm$^2$.

FIG. 28 is the result of evaluating adhesiveness between the spacers and the black layer for the substrate as above in the same manner as in Example 1, and it can be confirmed from the comparison of FIGS. 23 and 28 that in the case of Comparative Example 1, the adhesiveness is not ensured and thus the patterns are lost. The pattern retention rate of the substrate measured in the same manner as in Example 1 was in a level of about 65% or less (pattern loss rate: more than 35%).

Comparative Example 2

A spacer-containing substrate was produced in the same manner, except that in the process of Example 1, the irradiation light quantity of ultraviolet rays was adjusted to about 281 mJ/cm$^2$. FIG. 29 is the result of evaluating adhesiveness between the spacers and the black layer for the substrate as above in the same manner as in Example 1, and it can be confirmed from the comparison of FIGS. 23 and 29 that in the case of Comparative Example 2, the adhesiveness is not ensured and thus the patterns are lost. The pattern retention rate of the substrate measured in the same manner as in Example 1 was in a level of about 65% or less (pattern loss rate: more than 35%).

Comparative Example 3

A spacer-containing substrate was prepared in the same manner as in Comparative Example 2, except that the pressing speed of the mask was controlled to about 0.1 mpm or so. FIG. 30 is the result of evaluating whether or not foreign materials occur during the production process of the substrate as above, and it can be confirmed from the result that the foreign materials occur excessively. Such excessive foreign material occurrence was a level where the substrate could not be used.

Comparative Example 4

A spacer-containing substrate was prepared in the same manner as in Comparative Example 2, except that the pressing speed of the mask was controlled to about 0.2 mpm or so. FIG. 31 is the result of evaluating whether or not foreign materials occur during the production process of the substrate as above, and it can be confirmed from the result that the foreign materials occur excessively. Such excessive foreign material occurrence was a level where the substrate could not be used.

The invention claimed is:

1. A substrate, comprising:

a base layer;

a black layer;

an electrode layer disposed between the black layer and the base layer; and column spacers formed on the black layer, wherein the black layer is a multilayer structure comprising a first layer and at least one second layer, wherein the first layer is a metal layer and the at least one second layer is one of a metal oxide layer, a metal nitride layer, or a metal oxynitride layer, wherein each of the metals in the metal layer, the metal oxide layer, the metal nitride layer, and the metal oxynitride layer has a physical ductility value of 0.55 or more, wherein a loss rate of spacers is 15% or less, wherein the loss rate is measured by attaching a pressure-sensitive adhesive tape to the base layer, wherein the pressure-sensitive adhesive tape has a peel force of about 3.72 N/10 mm to about 4.16 N/10 mm, and peeling the pressure-sensitive adhesive tape from the base layer at a peel angle of 180 degrees in accordance with JIS Z 1522, and wherein the black layer is in contact with the electrode layer.

2. The substrate according to claim 1, wherein the base layer is a flexible base layer.

3. The substrate according to claim 1, wherein a ratio (T/B) of an area (B) of the black layer and an area (T) of a bottom of the column spacer is in a range of 0.5 to 1.5.

4. The substrate according to claim 1, wherein the black layer is a multilayer structure comprising the first layer and two second layers, wherein each second layer is disposed on opposing sides of the first layer, and wherein the two second layers are the same, and one of the metal oxide layer, the metal nitride layer or the metal oxynitride layer.

5. The substrate according to claim 1, wherein the black layer is a multilayer structure comprising the first layer and two second layers, each second layer on opposing sides of the first layer, and the two second layers are each, independently, one of the metal oxide layer, the metal nitride layer or the metal oxynitride layer.

6. The substrate according to claim 1, wherein the spacers have a hemispherical portion on the ends of the spacers opposite the black layer.

7. An optical device, comprising:

the substrate of claim 1; and a second substrate disposed opposite to the substrate, wherein a gap is maintained between the substrate and the second substrate by the column spacers.

* * * * *